United States Patent [19]

Bullock et al.

[11] 4,098,917

[45] Jul. 4, 1978

[54] METHOD OF PROVIDING A PATTERNED METAL LAYER ON A SUBSTRATE EMPLOYING METAL MASK AND ION MILLING

[75] Inventors: David Carl Bullock; Mohammed Sabir Shaikh, both of Dallas, Tex.

[73] Assignee: Texas Instruments Incorporated, Dallas, Tex.

[21] Appl. No.: 721,249

[22] Filed: Sep. 8, 1976

[51] Int. Cl. ................................................ H01f 10/00
[52] U.S. Cl. ...................................... 427/36; 96/35.1; 156/643; 427/35; 427/38; 427/43; 427/54; 427/130; 427/131; 427/132
[58] Field of Search ...................... 427/34, 36, 38, 43, 427/54, 128–132, 154, 259, 270–272, 282; 156/643, 652, 656, 659; 96/35.1

[56] References Cited

U.S. PATENT DOCUMENTS

| | | | |
|---|---|---|---|
| 3,406,043 | 10/1968 | Balde | 156/656 X |
| 3,753,814 | 8/1973 | Pulliam et al. | 156/656 |
| 3,808,068 | 4/1974 | Johnson et al. | 156/643 |
| 3,900,944 | 8/1975 | Fuller et al. | 156/656 X |
| 3,904,453 | 9/1975 | Revesv | 156/656 X |

Primary Examiner—Bernard D. Pianalto
Attorney, Agent, or Firm—James T. Comfort; Rene' E. Grossman; William E. Hiller

[57] ABSTRACT

Method of providing a substrate with a patterned metal layer disposed thereon, wherein a patterned metal mask is employed in conjunction with ion milling to form the pattern in the metal layer on the substrate. The metal mask as contemplated herein is made of a metallic masking mterial taken from the group consisting of vanadium, tantalum, titanium, and a titanium-tungsten alloy--vanadium being a preferred material because of its resistance to erosion or etching from ion milling coupled with its relatively fast etch rate in a plasma atmosphere. This method has particular application to magnetic bubble domain technology, wherein successive layers of a magnetically soft material, vanadium, and photoresist are deposited on a magnetic film capable of supporting magnetic bubble domain propagation. The layer of magnetically soft material is typically permalloy, and upon being patterned in a selected configuration, defines a bubble propagation path on the magnetic bubble-supporting film. The photoresist layer is selectively exposed to the predetermined pattern by a source of energy, such as an E-beam, X-ray or ultra violet light. The portions of the vanadium layer exposed by the development of the patterned photoresist layer are then plasma etched to form a metal mask of the remaining vanadium layer. The remaining photoresist is then stripped, and the permalloy layer is then ion milled with the patterned vanadium layer serving as the mask. Thereafter, the remaining vanadium layer is removed by subjecting it to plasma etching.

12 Claims, 7 Drawing Figures

METHOD OF PROVIDING A PATTERNED METAL LAYER ON A SUBSTRATE EMPLOYING METAL MASK AND ION MILLING

BACKGROUND OF THE INVENTION

This invention relates to a method of providing a substrate with a patterned metal layer disposed thereon, which method has particular application in magnetic bubble domain technology in providing a bubble propagation path of magnetically soft material, such as permalloy on a magnetic bubble-supporting film.

Photolithography techniques as applied to the manufacture of microminiaturized electronic circuit components are well known in the art. A layer of photoresist material sensitive to light, which generally comprises an organic polymer is deposited onto a substrate. The substrate typically may be a semiconductor wafer on which it is desired to form a patterned layer of material which may be either metal or non-metal. In a particular environment, overlay patterns of magnetically soft material (e.g. permalloy) are deposited on a magnetic bubble-supporting film for the purpose of forming bubble propagation paths along which magnetic bubble domains may be moved in response to changes in orientation of a rotary magnetic field in the plane of the magnetic bubble-supporting film. As the in-plane magnetic field is reoriented by the rotation thereof, magnetic poles generated by the bubble propagation path of magnetically soft material are moved, thereby causing movement of the magnetic bubble domains which are attracted by these magnetic poles.

Heretofore, the patterning of such bubble propagation paths from a layer of magnetically soft material applied to a magnetic bubble-supporting film has been accomplished by standard photolithography procedures employing the deposit of photorsist films onto the substrate containing the film of bubble-supporting material and the layer of magnetically soft material to be patterned. The photoresist layer is exposed selectively to electromagnetic radiation, which may include ultra violet light, X-rays, E-beam exposure, wherein the solubility of portions of the photoresist layer is changed. Development of the photoresist layer follows by subjecting same to the action of a solvent material which removes the more soluble portions of the photoresist layer, thereby uncovering parts of the underlying metal layer of magnetically soft material for subsequently etching in forming the desired pattern therein.

The use of ion-milling as an etching technique for subsequently patterning the exposed portions of the layer of magnetically soft material through the patterned photoresist layer has heretofore been generally unsuccessful because the ion milling treatment tended to induce an unsuitably high removal rate of the photoresist layer while also generating sufficient heat in the milling process tending to soften the organic polymer material comprising the photoresist layer.

Additionally, where the photoresist layer itself forms the patterned mask for the underlying layer of magnetically soft material, generally the thickness of the photoresist layer has been of sufficient magnitude to put a restrictive limit on the resolution quality obtainable therefrom in the resulting patterned bubble propagation path of magnetically soft material. In such instance, the increasing emphasis on smaller and smaller geometries for bubble propagation path patterns necessary to accommodate the use of bubbles having diameter sizes of 0.50 microns or lower requires extremely high resolution in transferring the pattern from the developed photoresist layer to the underlying layer of magnetically soft material. Moreover, the photoresist material tends to break down at the edges of the pattern-forming openings therein during the etching procedure as practiced on the exposed regions of the underlying layer of magnetically soft material. This degradation of the edges of the patterned photoresist layer adversely affects the resolution quality of the subsequent pattern obtained in the layer of magnetically soft material following the treatment of the selected regions thereof exposed through the openings in the patterned photoresist layer.

SUMMARY OF THE INVENTION

This invention is directed to a method of providing a substrate with a patterned layer of metal or non-metal disposed thereon, wherein the layer to be patterned is deposited onto the substrate, and a metal mask is subsequently formed therein which protects selected portions of the layer to be patterned. The exposed regions of the layer to be patterned are then subjected to etching, such as by ion milling, for removing these regions, thereby producing a pattern in the remaining portions of the layer to be patterned, following which the metal mask is subjected to plasma etching so as to be stripped from the structure to expose the patterned layer of material previously covered thereby.

In forming the pattern in the metal mask, a layer of a metallic masking material taken from the group consisting of vanadium, tantalum, titanium and a titanium-tungsten alloy is deposited onto the layer to be patterned. Thereafter, a layer of photosensitive material, i.e. photoresist, is deposited onto the layer of the metallic masking material, the layer of photosensitive material being selectively exposed to a source of light. After the photosensitive material is developed to define a pattern therein exposing selected regions of the layer of metallic masking material, the exposed regions of the layer of metallic masking material are subjected to a plasma etch to selectively remove these exposed regions down to the level of the layer to be patterned. Thereafter, the remaining portion of the layer of photosensitive material is removed. In this way, the remaining portions of the layer of metallic masking material are exposed as a patterned metal mask protecting selected portions of the layer to be patterned.

In accordance with a specific embodiment of the invention, the layer of metallic masking material is vanadium, which has the properties of being etched at a relatively fast rate in a plasma atmosphere while also being resistant to ion milling so as to be etched at a slow rate when subjected to this treatment. Thus, in a specific aspect of the invention, the method is employed to construct a magnetic bubble domain memory chip by forming a patterned bubble propagation path of magnetically soft material on a magnetic bubble-supporting film secured to a non-magnetic substrate. In this instance, the layer of material to be patterned which is deposited onto the substrate takes the form of a layer of magnetically soft material overlying a magnetic bubble-supporting film, with the layer of metallic masking material and the layer of photosensitive material being deposited thereon in sequence. After development of the layer of photosensitive material to define a pattern therein exposing selected regions of the layer of metallic masking material, these exposed regions of metallic masking material are subjected to a plasma etch for selective removal of same down to the level of the layer of magnetically soft material. The remaining portion of the layer of photosensitive material is then stripped, exposing the remaining portions of the layer of metallic masking material as a patterned metal mask which protects selected portions of the layer of magnetically soft material disposed therebeneath. Ion milling is then employed to remove the exposed regions of the layer of magnetically soft material, thereby producing the bubble propagation path pattern in the remaining portions of the layer of magnetically soft material as protected by the overlying patterned layer of metallic masking material. The patterned metal mask is then subjected to a plasma etch for stripping the metallic mask from the structure to expose the bubble propagation path pattern of magnetically soft material previously covered thereby.

In this technique, the layer of photoresist material employed may be relatively thin, since the actual patterned mask in forming the desired pattern in the layer to be patterned is provided by the metal mask. Use of a layer of photoresist material of relative thinness enables the method in accordance with this invention to provide extremely fine geometry patterns, wherein resolutions of one micron or smaller are achievable. The subsequent ion milling of the layer to be patterned enables the resolution achieved to approach 0.25 microns.

DETAILED DESCRIPTION

Referring more specifically to the drawings, FIGS. 1–6 illustrate respective stages in sequence of the method of providing a substrate with a patterned layer disposed thereon. In a preferred application, the method is employed for forming a magnetic bubble propagation path pattern on a magnetic bubble domain memory chip, wherein the magnetic bubble propagation path pattern is formed from a layer of magnetically soft material as initially deposited onto the magnetic bubble domain chip. It will be understood, however, that the present method is susceptible of wider application in the patterning of layers as disposed on a substrate where small geometry patterns are to be employed requiring high resolution in transferring the pattern to the layer of material on the substrate.

Figure 1:
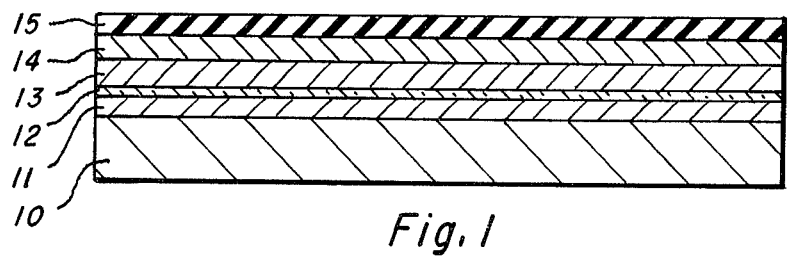
FIGS. 1–6 are cross-sectional views illustrating respective sequential stages in the method of providing a patterned layer on a substrate in accordance with the present invention.

To this end, FIG. 1 illustrates a cross-sectional view of a magnetic bubble domain memory chip which comprises an oriented slice cut from a single crystal of rare earth garnet or equivalent material including a substrate portion 10 of non-magnetic garnet material having a planar magnetic bubble-supporting magnetic film or layer 11 disposed thereon. The magnetic film 11 possesses uniaxial anisotrophy and may be an epitaxially deposited garnet layer of the order of 2–5 microns in thickness and having an easy magnetization in a direction perpendicular to the plane of the layer 11. A spacing layer 12 of silicon dioxide, for example, of the order of 0.5–1 micron in thickness, is disposed on the epitaxial magnetic bubble-supporting layer 11 so as to be interposed between the bubble-supporting layer 11 and a layer 13 of magnetically soft material which is to be patterned in accordance with the method of this invention to form a bubble propagation path. To this end, the magnetically soft metal material, e.g. permalloy, is deposited onto the silicon dioxide layer 12 as a thin overlay metal film 13 of the order of 4000 A – 5,000 A.

Thereafter, a layer 14 of a metallic masking material is deposited onto the layer 13 of magnetically soft metal material to be patterned. In accordance with this invention, the metallic masking material comprising the layer 14 is then from the group consisting of vandium, tantalum, titanium and a titanium-tungsten alloy, vanadium being a preferred metallic masking material. The layer 14 of metallic masking material is deposited to a thickness of approximately 2,000 A – 3,000 A. Completing the sequence of steps of depositing layers onto the composite substrate including the substrate 10, the magnetic bubble-supporting planar layer 11, and the silicon dioxide layer 12, a layer 15 of photosensitive material, i.e. photoresist, is deposited onto the layer 14 of metallic masking material, thereby defining the multi-layer sandwich structure illustrated in FIG. 1.

Figure 2:
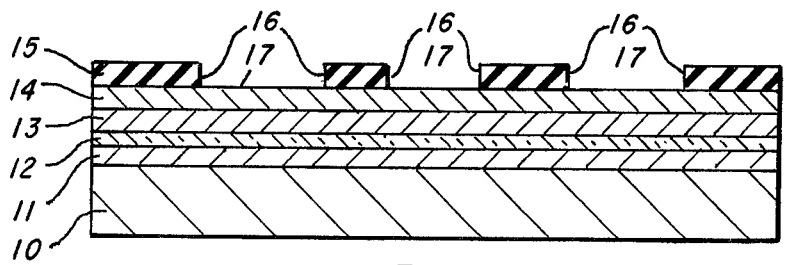
Figure 3:
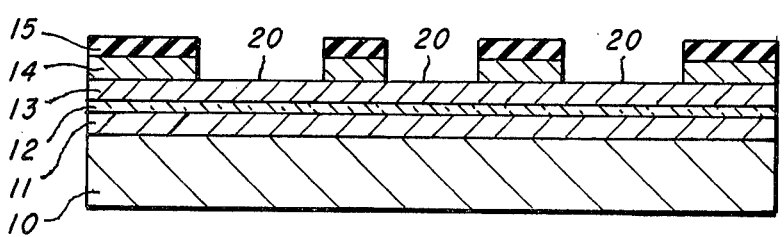

The photoresist layer 15 is then exposed to a suitable source of light in a typical photolithographic precedure, the exposure being selective in accordance with a predetermined pattern to be subsequently formed in the metal layer 13 to be patterned. Any suitable energy source may be employed for this purpose, such as ultra violet light, X-rays, E-beam exposure, wherein the solubility of selected portions of the photoresist layer 15 is changed with respect to the solubility of the remaining portions of the photoresist layer 15 not exposed to the light source. Upon developing the photoresist layer 15 with solvents in the usual manner, a pattern is formed in the photoresist layer 15 by the removal of the more soluble portions thereof to form openings or windows 16 therethrough (FIG. 2). The openings or windows 16 formed in the developed photoresist layer 15 expose selected regions 17 of the layer 14 of metallic masking material. The assembly is then subjected to an etching procedure, wherein the exposed regions 17 of the layer 14 of metallic masking material are acted upon by the etchant atmosphere, while the remaining patterned layer 15 of photoresist material protects those portions of the layer 14 of metallic masking material which it overlies. In a preferred embodiment of the method, plasma etching is relied upon for selectively removing the exposed regions 17 of the layer of metallic masking material 14 down to the level of the metal layer 13 to be patterned (FIG. 3). For example, a suitable plasma etching procedure for etching metal is described in U.S. Pat. No. 3,951,709 issued Apr. 20, 1976 to Adir Jacob.

Figure 4:
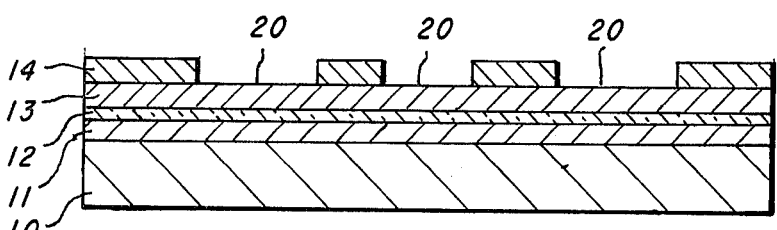

Plasma etching of the exposed regions 17 of the layer 14 of metallic masking material defines the pattern of the photoresist layer 15 in the metallic masking layer 14, thereby exposing selected portions 20 in the layer of magnetically soft metal material 13 to be patterned. The remaining portions of the patterned layer 15 of photoresist is then removed by employing a suitable solvent as a stripping solution, thereby exposing the patterned layer 14 of metallic masking material as an in-situ patterned metal mask protecting selected portions of the metal layer 13 to be patterned (FIG. 4).

Figure 5:
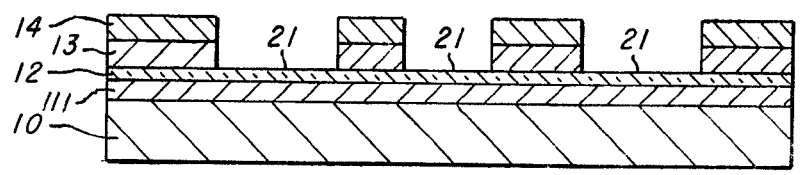
Figure 6:
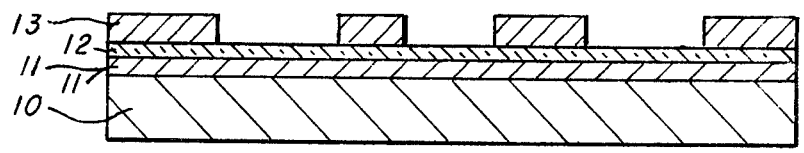
Figure 7:
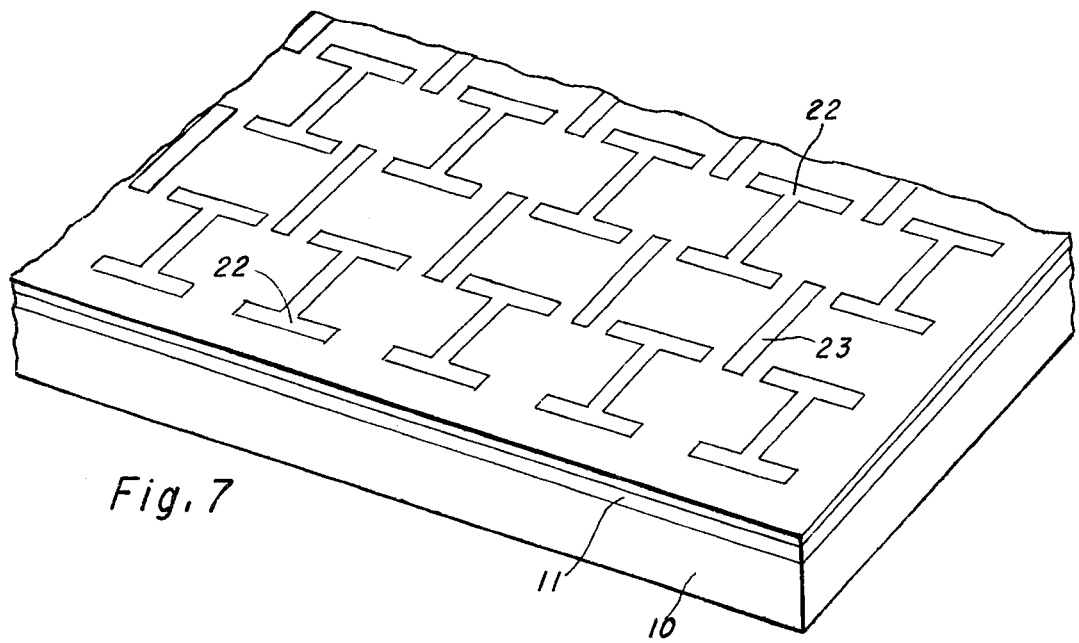
FIG. 7 is a fragmentary perspective view illustrating a magnetic bubble domain memory chip having a patterned bubble propagation path provided thereon in accordance with the method as shown in FIGS. 1–6.

The in-situ metal mask 14 and the exposed portions 20 of the metal layer 13 to be patterned are then subjected to ion milling. In this connection, it will be understood that the metallic masking material of the metal mask 14 must possess a higher resistivity to ion milling than the metal material of the layer 13 to be patterned such that upon completion of the ion milling treatment, a thin residual layer of the metal mask 14 remains above the now patterned metal layer 13 of magnetically soft material (FIG. 5). The ion milling treatment continues until the exposed portions 20 of the metal layer 13 to be patterned are removed, thereby exposing corresponding regions 21 in the underlying layer 12 of silicon dioxide. At this stage of the method, the desired pattern has been formed in the metal layer 13, and the resulting structure as illustrated in FIG. 5 is then subjected to an etching procedure to remove the remaining portion of the metal mask 14 (FIG. 6). Thus, the resulting structure includes a patterned bubble propagation path 13 disposed on the spacing layer 12 of silicon dioxide and overlying the magnetic bubble-supporting film 11. The completed overlay pattern as formed in the metal layer 13 may be of the configuration shown in FIG. 7, for example, wherein alternating rows of generally H-shaped propagation path elements 22 and bar elements 23 are provided on the magnetic bubble domain chip. It will be understood, however, that the particular configuration of the bubble propagation path elements as depicted in FIG. 7 is for purposes of example only, since the shapes of the individual bubble propagation path elements may vary to a considerable degree depending upon the desired form of the bubble propagation path pattern to be utilized on the chip.

While the metallic masking material employed for the metal mask 14 formed during the method herein disclosed is preferably made of vanadium, it is contemplated that tantalum, titanium and a titanium-tungsten alloy could be employed as the metallic masking material of the layer 14. However, vanadium is preferred because of its relatively fast etching rate under subjection to an appropriate plasma atmosphere in a plasma etching procedure of the type described in the aforesaid U.S. Pat. No. 3,951,709, for example. In this respect, it has been determined that vanadium may be etched under plasma etching conditions at a rate several times faster than chromium. As compared to tantalum, titanium, and a titanium-tungsten alloy, vanadium etches at a relatively fast rate under plasma etching procedures, while each of the four-mentioned metallic masking materials is relatively resistant to etching by ion milling as contrasted to permalloy. Thus, the metal mask 14 of any of these four-mentioned metallic masking materials is able to continue as a protective mask for the underlying portion of the metal layer 13 of magnetically soft material until the pattern has been completely formed therein by removal of the exposed regions 20 of the metal layer 13 during the ion milling treatment. Ion milling as referred to herein refers to the use of accelerated ions striking the surface of the metal layer 13 at insufficient energy levels to be implanted such that the ions bounce off the surface and cause erosion thereof. Ion milling is described in an article by E. G. Spencer and P. H. Schmidt entitled "Ion-Beam Techniques for Device Fabrication" appearing in the *Journal of Vacuum Science and Technology,* Vol. 8, No. 5, p. 552-570 (1971) A collimated beam of argon ions at 1 Kev and a pressure of $2 \times 10^{-4}$ torr has been employed in patterning the metal layer 13 by ion milling in the manner described.

The method herein disclosed enables the use of thinner photoresist layers with resulting improvement in the quality of resolution of the pattern as subsequently formed in the metal layer 13, while also facilitating eventual removal of the patterned photoresist layer 15 and the metal mask 14. As a particular example, where E-beam exposure is employed, the photoresist layer 15 may be PMMA, a polymethyl methacrylate organic compound which is a positive E-beam resist available from E. I. DuPont deNemours of Wilmington, Del.

While a particular embodiment of the invention has been shown and described, it will be understood that variations and modifications thereof can be made within the scope of the invention by those skilled in the art. Therefore, it is intended that the appended claims be interpreted as broadly as reasonably permitted by the prior art to include all such variations and modifications within the scope of the present invention.

We claim:

1. A method of providing a substrate with a patterned metal layer disposed thereon, said method comprising:
    depositing a metal layer to be patterned onto the substrate;
    depositing a layer of a metallic masking material taken from the group consisting of vanadium, tantalum, titanium and titanium-tungsten alloy to cover the metal layer;
    depositing a layer of photosensitive material onto the layer of the metallic masking material;
    selectively exposing the layer of photosensitive material to a source of light;
    developing the photosensitive material to define a pattern therein exposing selected regions of the layer of metallic masking material;
    subjecting the exposed regions of the layer of metallic masking material to a plasma etch to selectively remove said exposed regions of metallic masking material down to the level of the metal layer to be patterned;
    removing the remaining portion of the layer of photosensitive material to expose the remaining portions of the layer of metallic masking material as a patterned metallic mask which protects selected portions of the metal layer to be patterned;
    subjecting the exposed regions of the metal layer to ion milling for removing the said regions, thereby producing a pattern in the remaining portions of the metal layer to be patterned; and
    subjecting the patterned metallic mask to a plasma etch for stripping the metallic mask so as to expose the patterned metal layer previously covered thereby.

2. A method as set forth in claim 1, wherein the layer of metallic masking material is vanadium.

3. A method as set forth in claim 2, wherein the layer of photosensitive material is selectively exposed to E-beam radiation.

4. A method as set forth in claim 2, wherein the layer of photosensitive material is selectively exposed to X-ray radation.

5. In a method of constructing a magnetic bubble domain memory chip which is formed of a non-magnetic substrate and a magnetic bubble-supporting film secured to said substrate; the procedure comprising:
    depositing a layer of magnetically soft material overlying the magnetic bubble-supporting film;
    depositing a layer of metallic masking material taken from the group consisting of vanadium, tantalum, titanium and a titanium-tungsten alloy to cover the layer of magnetically soft material;

depositing a layer of photosensitve material onto the layer of the metallic masking material;

selectively exposing the layer of photosensitive material to a source of light;

developing the photosensitive material to define a pattern therein exposing selected regions of the layer of metallic masking material;

selectively removing the exposed regions of the layer of metallic masking material down to the level of the layer of magnetically soft material for exposing selected regions of the layer of magnetically soft material;

removing the remaining portion of the layer of photosensitive material to expose the remaining portions of the layer of metallic masking material as a patterned metallic mask which protects selected portions of the layer of magnetically soft material disposed therebeneath;

removing the exposed regions of the layer of magnetically soft material, thereby producing a bubble propagation path pattern in the remaining portions of the layer of magnetically soft material protected by the overlying patterned layer of metallic maskin material; and stripping the patterned metallic mask so as to expose the bubble propagation path pattern of magnetically soft material previously covered thereby.

6. A method as set forth in claim 5, wherein the layer of metallic masking material is vanadium.

7. A method as set forth in claim 6, wherein the layer of photosensitive material is selectively exposed to E-beam radiation.

8. A method as set forth in claim 6, wherein the layer of photosensitive material is selectively exposed to X-ray radiation.

9. In a method of constructing a magnetic bubble domain memory chip which is formed of a non-magnetic substrate and a magnetic bubble-supporting film secured to said substrate; the procedure comprising:

depositiong a layer of magnetically soft material overlying the magnetic bubble-supporting film;

depositing a layer of metallic masking material taken rom the group consisting of vanadium, tantalum, titanium and a titanium-tungsten alloy to cover the layer of magnetically soft material;

depositing a layer of photosensitive material onto the layer of the metallic masking material;

selectively exposing the layer of photosensitive material to a source of light;

developing the photosensitive material to define a pattern therein exposing selected regions of the layer of metallic masking material;

subjecting the exposed regions of the layer of metallic masking material to a plasma etch to selectively remove said exposed regions of metallic masking material down to the level of the layer of magnetically soft material for exposing selected regions of the layer of magnetically soft material;

removing the remaining portion of the layer of photosensitive material to expose the remaining portions of the layer of metallic masking material as a patterned metallic mask which protects selected portions of the layer of magnetically soft material disposed therebeneath;

subjecting the exposed regions of the layer of magnetically soft material to ion milling for removing the said regions, thereby producing a bubble propagation path pattern in the remaining portions of the layer of magnetically soft material protected by the overlying patterned layer of metallic masking material; and subjecting the patterned metallic mask to a plasma etch for stripping the metallic mask so as to expose the bubble propagation path pattern of magnetically soft material previously covered thereby.

10. A method as set forth in claim 9, wherein the layer of metallic masking material is vanadium.

11. A method as set forth in claim 10, wherein the layer of photosensitive material is selectively exposed to E-beam radiation.

12. A method as set forth in claim 10, wherein the layer of photosensitive material is selectively exposed to X-ray radiation.

* * * * *